(12) United States Patent
Han et al.

(10) Patent No.: US 7,092,134 B1
(45) Date of Patent: Aug. 15, 2006

(54) METHOD AND APPARATUS FOR RECORDING A HOLOGRAM FROM A MASK PATTERN BY THE USE OF TOTAL INTERNAL REFLECTION HOLOGRAPHY AND HOLOGRAM MANUFACTURED BY THE METHOD

(76) Inventors: Woo-Sung Han, Yeoksam Hanshin, Apt. 2-1305, Dogk-Dong 895-8, Seocho-Gu, Seoul (KR); Olivier H. Carnal, Bütenring 7, CH-8595 Altnau (CH); Francis Stace Murray Clube, Chemin des Ribaudes 26, CH-2000 Neuchâtel (CH)

( * ) Notice: Subject to any disclaimer, the term of this patent is extended or adjusted under 35 U.S.C. 154(b) by 0 days.

(21) Appl. No.: 10/009,944

(22) PCT Filed: Jun. 13, 2000

(86) PCT No.: PCT/IB00/00794

§ 371 (c)(1),
(2), (4) Date: Aug. 26, 2002

(87) PCT Pub. No.: WO01/13181

PCT Pub. Date: Feb. 22, 2001

(30) Foreign Application Priority Data

Jun. 11, 1999 (EP) .................................. 99111446

(51) Int. Cl.
*G03H 1/04* (2006.01)

(52) U.S. Cl. ............................. 359/35; 359/12; 430/1; 430/2

(58) Field of Classification Search .................. 359/35, 359/12, 27; 430/1, 2
See application file for complete search history.

(56) References Cited

U.S. PATENT DOCUMENTS

| 3,796,476 | A | * | 3/1974 | Frosch et al. | 359/1 |
| 4,943,126 | A | * | 7/1990 | Lang et al. | 359/12 |
| 5,268,985 | A | * | 12/1993 | Ando et al. | 385/129 |
| 5,295,208 | A | * | 3/1994 | Caulfield et al. | 385/27 |
| 5,528,390 | A | * | 6/1996 | Goto et al. | 359/12 |
| 5,640,257 | A | * | 6/1997 | Clube | 359/30 |
| 5,648,857 | A | * | 7/1997 | Ando et al. | 359/12 |

FOREIGN PATENT DOCUMENTS

| EP | 0 421 645 A2 | * | 4/1991 |
| GB | 2176628 A | * | 12/1986 |

* cited by examiner

*Primary Examiner*—Leonidas Boutsikaris

(57) ABSTRACT

The present invention relates to a method and an apparatus for forming a hologram from a mask. According to the invention a photoresist is used as the holographic recording medium and the planes of polarisation of the object and reference beams incident on the holographic recording medium are arranged such that their polarisation vectors are substantially mutually orthogonal in the holographic recording medium and such that the polarisation vectors of the incident and totally internally reflected reference beams are also substantially orthogonal. Preferably, just the transmission hologram is formed in the holographic recording layer.

39 Claims, 3 Drawing Sheets

Figure 1:
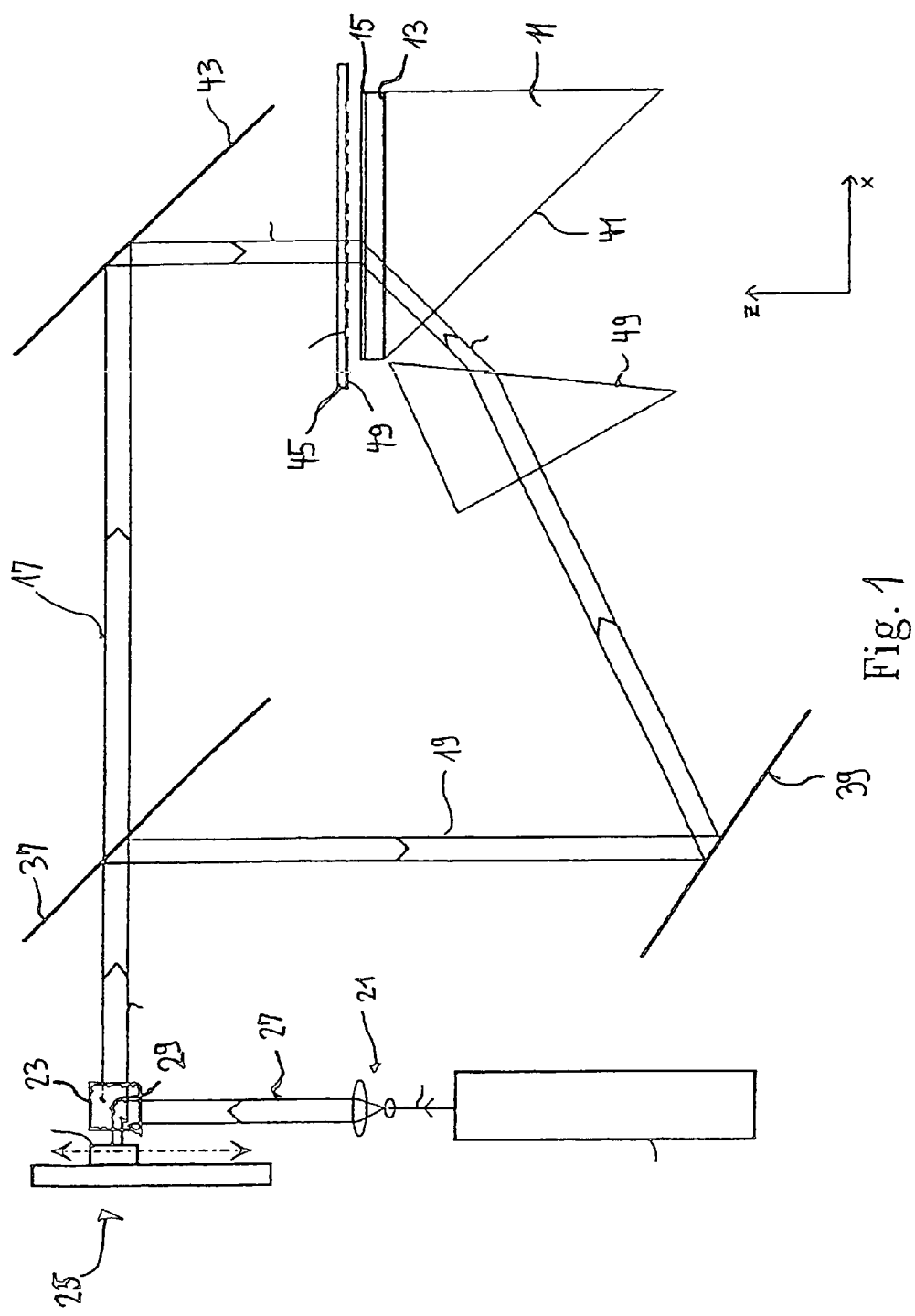

METHOD AND APPARATUS FOR RECORDING A HOLOGRAM FROM A MASK PATTERN BY THE USE OF TOTAL INTERNAL REFLECTION HOLOGRAPHY AND HOLOGRAM MANUFACTURED BY THE METHOD

The present invention relates to a total internal reflection holographic apparatus and a method of forming a hologram and reconstructing an image therefrom.

The principles of total internal reflection (TIR) holography have been described already in U.S. Pat. No. 4,857,425. Since then many efforts have been made to make use of TIR holography in the microelectronics industries. Prior art references are e.g. U.S. Pat. No. 4,917,497, U.S. Pat. Nos. 4,966,428, 5,187,372, U.S. Pat. No. 5,640,257 and European application no. 98300188 whose contents are herewith incorporated by reference.

Frosch et al. (U.S. Pat. No. 3,796,476) recorded TIR holograms of mask patterns using photographic emulsion, i.e. grains of silver halide dispersed in a gelatin film, as the holographic recording material. Such a material records information by modulating the bulk properties of the material (either its absorption or refractive index) and is referred to hereinafter as a "volume recording material".

Normally in TIR holography the three recording beams (object beam, incident reference beam and totally internally reflected beam) give rise to three holograms in the recording material. The interference between the incident reference beam and the object beams, produces a reflection hologram, the interference between the totally internally reflected reference beam and the object beam produces a transmission hologram and the interference between the incident reference beam and the totally internally reflected reference beam produces a Lippmann hologram. Frosch et al. disclosed object and reference beams whose planes of polarisation they claimed to be orientated such that only one hologram is formed (either the reflection hologram formed by interference of the object beam with the incident reference beam or the transmission hologram formed by the interference of the object beam with the reflected reference beam) for the purpose of avoiding the (perceived) problem of loss of resolution due to shrinkage of the emulsion between recording and replay. According to Frosch et al., when both of the aforementioned holograms are present, shrinkage of the emulsion causes the images generated by the two holograms of Frosch et al. to shift relative to each other, and this degrades the resolution.

Since 1974, when U.S. Pat. No. 3,796,476 was published, no subsequent prior art on TIR holography directed at high resolution lithography has employed the polarisation scheme proposed by Frosch et al. The reasons for this are as explained above: for volume holography, not only does the method not offer any useful purpose but also the scheme disclosed does not work as described.

The overwhelming part of the literature relating to the application of TIR holography to microlithography concerns volume holography. In particular, the holograms are generally recorded in photopolymer materials manufactured e.g. by DuPont Nemours. With this material the pattern in the mask is recorded as a modulation of the refractive index in a layer of typically ~10 μm thickness. This material functions well for recording holograms using visible or near ultra-violet light (i.e. down to a wavelength of ~350 nm). In contrast thereto, "surface-relief" holography records the mask pattern information as a modulation of thickness of the recording layer.

In 1988 Ross et al. reported on recording TIR holograms of mask patterns using a wavelength of 458 nm, S-polarisation (i.e. electric field vector perpendicular to the plane of incidence of the reference beam at the recording layer) for the object and reference beams and using the surface-relief material photoresist as the holographic recording material. They used an argon-ion laser operating at 458 nm as the light source. They were able to obtain hologram efficiencies of only ~5% which they partly attributed to the problem of obtaining deep surface-relief structures in the photoresist because of the intensity distribution of the 3 interfering beams in the photoresist (object beam, incident reference beam and reflected reference beam) and the development process which preferentially etches the high intensity regions.

An approach for achieving higher resolution from TIR holographic lithography is to reduce the wavelength of the light source for recording and replay from the commonly used value of 364 nm to a value of, for instance, 248 nm or 193 nm which are in the deep ultra-violet part of the spectrum and are produced by krypton fluoride and argon fluoride excimer lasers respectively. These laser sources are widely used by the micro-electronics industry in lens-based lithographic systems. Volume holographic recording materials for such wavelengths are however not readily available.

It is an object of the present invention to provide an improved method and apparatus for forming a total internal reflection (TIR) hologram and reconstructing an image therefrom. In particular, it is an object to provide better resolution so that still smaller features can be recorded in a hologram and subsequently be reproduced therefrom.

According to the invention there is provided a method according to the pre-characterizing part of claim 1 wherein a photoresist is employed as the holographic recording medium and the planes of polarisation of the object and reference beams incident on the holographic recording medium are arranged such that their polarisation vectors are substantially mutually orthogonal in the holographic recording medium and such that the polarisation vectors of the incident and totally internally reflected reference beams are also substantially orthogonal.

However, the present inventors have found that the contention of Frosch et al., namely that shrinkage causes a relative shift of the two images reconstructed from the two holograms, is not true. In fact, shrinkage of the emulsion does not cause either of the images to shift and thus there is no relative shift of the two.

The present inventors have further found that the teaching of Frosch et al. with respect to the planes of polarisation required of the object and reference beams to limit the number of holograms formed to just one is also, in fact, invalid. Frosch et al. assert that the plane of polarisation of the incident reference beam should be at an angle of 45° with respect to its plane of incidence and that the plane of polarisation of the object beam should be parallel or orthogonal to the plane of polarisation of the incident reference beam. They state (U.S. Pat. No. 3,796,476, col. 4 lines 35–42) that "this selection of the plane of polarisation of the (incident) reference beam $B_1$ ensures that near the bordering angle of the total reflection—owing to the turning of the plane of polarisation by 90°—no interference pattern can form between the two reference beams $B_1$ and $B_2$". The authors of the present invention have found this statement to be incorrect in that the plane of polarisation selected for the reference beam is not rotated by 90° on total internal reflection but instead remains substantially unchanged and results in a strong interference pattern being formed between the two reference beams $B_1$ and $B_2$.

Advantageously, substantially only the transmission hologram is recorded in the holographic recording layer. Surprisingly, this gives the best results as to resolution and contrast of the hologram. These findings are in contrast to the teaching of Frosch et al. (U.S. Pat. No. 3,796,496) who teach to record the reflection hologram. By recording substantially only the transmission hologram, TIR holography can be used effectively for recording submicron features in surface relief holograms. Advantageously, the plane of polarisation of the object beam is at 45° to the plane of incidence of the reference beam at the holographic recording layer. This allows to further reduce the contribution to the reflection and Lippman holograms.

Advantageously, the photoresist material is selected such that its thickness (d) and absorption (a) meet the condition a*d<1. Since the resist thickness (d) is coupled with the absorption coefficient (a) to determine the transmittance (T) of the resist through the formula $T=\exp(-4\pi\kappa/\lambda_o)^* = \exp(-a^*d)$, the product a*d is of concern ($\kappa$=extinction coefficient, $\lambda$=wavelength). The photoresist should preferably also be selected such that its contrast described by its gamma-value satisfies the condition $\gamma<3$. Advantageously, the resolution of the photoresist is selected such that its resolution described by the smallest period, $\Lambda$, of grating that can be optically recorded in the material with a modulation depth $(d_{max}-d_{min})/(d_{max}+d_{min})>25\%$ should satisfy the condition $\Lambda<200$ nm. It has further been found that the best results can be obtained if the thickness of the photoresist layer is less than 500 nm, preferably between 100 and 300 nm and most preferably between 200 and 300 nm.

It has additionally been found that both positive and negative photoresists can be employed.

It is preferred that the laser light used has a wavelength of below 300 nm, and preferably a wavelength of 248 nm or 193 nm. Further, it is advantageous that the intensity of the reference beam exceeds that of the object beam, by a factor 2, and preferably is 4:1.

For a better long-term stability of the hologram it is further advisable that the image recorded in the photoresist as a surface relief hologram be subsequently transferred into the underlying substrate material by an etching process, such as by plasma etching.

Although the hologram can be formed in a single exposure, preferably beams of a restricted cross-section are used and the hologram is formed by a scanning operation. The inventive process is particularly useful for transferring features of less than 1 μm, preferably less than 0.5 μm, from a mask into a hologram for use in microlithography.

Preferably, the angle of incidence of the beam in the recording layer is less than 45°, preferably less than 42° and most preferably less than 40°. By this arrangement the contribution to the reflection and Lippman holograms can be reduced to a minimum. Advantageously, a photoresist is employed whose refractive index at the exposure wavelength is greater than 1.6 and preferably greater than 1.7.

The present invention relates also to a total internal reflection holographic recording apparatus for recording a hologram from a mask, comprising an optical coupling element for receiving a substrate on a first face;

a substrate bearing a holographic recording layer, the substrate being in optical contact with said first face of the optical coupling element, a mask bearing a pattern arranged in proximity and parallel to the holographic recording layer, a light source for generating a light beam;

optical means for generating a collimated light beam of a selected cross-section;

means, such as a beam-splitter, prism or the like, for dividing the collimated light beam into two coherent light beams, a reference light beam and an object light beam;

means for directing the reference light beam at a second face of the coupling element such that it illuminates the interface between the holographic recording layer and the ambient medium at an angle greater than the critical angle;

means for directing the object light beam at the first face of the coupling element such that it is overlaps the reference beam in the plane of the holographic recording medium on the substrate in contact with the first face;

characterized in that the holographic recording medium is a photoresist and means are provided for arranging the planes of polarisation of the object and reference beams incident on the holographic recording medium such that their polarisation vectors are substantially mutually orthogonal in the holographic recording medium and such that the polarisation vectors of the incident and totally internally reflected reference beams are also substantially orthogonal. Further advantageous features are defined in the sub-claims.

The coupling element is for instance a prism or a grating on a transparent plate such as a fused silica substrate as described in the co-pending European application no. EP 98300188 (published under no. EP 0 930 549). The coupling element disclosed in EP 0 930 549 is a substrate having a periodic grating structure on the first surface whose period, in relation to the incident angle and wavelength of the light and the refractive index of the plate material is such that only a zeroth and one first order beams of the light being incident on the first surface at a predetermined incident angle are transmitted into the plate and that the transmitted first diffraction order is essentially totally reflected at the second surface/air interface. Thus, the grating can behave like a prism in a TIR holographic process.

Advantageously the apparatus comprises means for measuring the gap between the holographic recording layer and the mask preferably at the center of the scanning illumination beam, and means for adjusting the separation between the holographic recording layer and the mask.

According to another independent aspect of the invention a method of forming a hologram from a information containing mask is provided, comprising the following steps:

arranging a substrate bearing a layer of a holographic recording medium on a first face of a coupling element and in optical contact therewith;

arranging a information containing mask in a spaced relationship and parallel to the substrate;

generating an illumination light beam and then splitting the light beam into an object beam and a reference beam;

directing the object beam through the mask to the substrate such that it overlaps with the reference beam in the holographic recording medium;

further including the steps of employing a photoresist as the holographic recording medium;

directing the reference beam to a second face of the coupling element in a way that the condition for total internal reflection at the interface between the recording medium and the ambient medium is fulfilled and so that the angle of incidence of the beam in the recording layer is less than 45°, preferably less than 42° and most preferably less than 40°;

arranging the planes of polarisation of the object and reference beams incident on the holographic recording medium such that their polarisation vectors are substantially mutually orthogonal in the holographic recording medium and such that the polarisation vectors of the incident and totally internally reflected reference beams are also substantially orthogonal.

The authors of the present invention have determined that with an angle of incidence for the reference beam within the holographic recording layer of 45°, which is the angle employed by Frosch et al. and also the angle generally employed in the field of TIR holography using volume recording materials, that no planes of polarisation of the incident reference and object beams exist that permit only or substantially only one hologram to be formed in the holographic recording layer.

The inventors have found that photoresist materials generally have higher refractive indices than the volume recording materials employed in the prior art (whose index is generally ~1.5) and this allows the angle of incidence of the reference beam in the recording layer to be significantly less than 45° without violating the condition for total internal reflection Arranging that the angle of incidence of the reference beam is significantly less than an angle of 45° permits the planes of polaristion of the reference and object beams to be selected in order to suppress the Lippmann and reflection holograms so that substantially only the transmission hologram is formed.

The contrast of the Lippmann hologram $C_{Lipp}$ is dependent on the polarisation vectors of the incident and reflected reference beams according to $$C_{Lipp} = (P_{ir} \cdot P_{rr})$$

where $P_{ir}$ and $P_{rr}$ are the polarisation vectors of the incident and reflected reference beams. If we neglect polarisation rotation on total internal reflection (which is a valid approximation near the critical angle) then $C_{Lipp}$ is minimized when $$\tan^2 \theta_r = \cos 2\theta_{pr} \qquad \text{equ. (1)}$$

where $\theta_r$ is the angle the plane of polarisation of the reference beam makes with the plane of incidence of the reference beam at the holographic recording layer and where $\theta_{pr}$ is the angle of incidence of the reference beam in the photoresist.

Similarly, the contrast of the reflection hologram is dependent on $$C_{refl} = (P_{ir} \cdot P_o)$$

where $P_o$ is the polarisation vector of the incident object beam and this is minimized when $$\tan \theta_r \tan \theta_o = -\cos \theta_{pr} \qquad \text{equ. (2)}$$

Thus, equations (1) and (2) allow the planes of polarisation of the incident reference and object beams to be selected in order to that the transmission hologram is preferentially recorded in the holographic layer.

Let us take as an example a layer of photoresist of refractive index 1.8 on a transparent substrate of refractive index 1.5 and with the angle of incidence of the reference beam in the substrate to be 45°. From Snell's law the angle of incidence of the reference beam in the photoresist, $\theta_{pr}$, is calculated to be:

$$\theta_{pr} = 36°$$

Hence, using equ. (1) above, the plane of polarisation of the incident reference beam should be oriented such that $$\theta_r = 29°$$

and, using equ. (2), the plane of polarisation of the object beam should be oriented such that $$\theta_o = -56°$$

Whereas the formulae and angles calculated above are applicable for masks containing line geometries oriented parallel to a single axis, in the case of masks containing grating structures in two orthogonal x and y directions, the inventors have found that advantageously the plane of polarisation of the object beam should be in the range −43° to −47° and preferably −45° and that the plane of polarisation of the reference beam should again be calculated according to equ. 2 above. Thus, for the particular photoresist considered in the example above, the corresponding angle of polarisation of the reference beam should be in the range 37° to 41° and preferably 39°.

Advantageously, a photoresist is employed whose refractive index at the exposure wavelength is greater than 1.6 and preferably greater than 1.7. Further advantageous embodiments of the invention are defined in the subclaims.

Subject of the present invention is also a total internal reflection holographic recording apparatus for recording a hologram from a mask, comprising an optical coupling element for receiving a substrate on a first face;

a substrate bearing a holographic recording layer, the substrate being in optical contact with said first face of the optical coupling element, a mask bearing a pattern arranged in proximity and parallel to the holographic recording layer, a light source for generating a light beam;

optical means for generating a collimated light beam of a selected cross-section;

means, such as a beam-splitter, prism or the like, for dividing the collimated light beam into two coherent light beams, a reference light beam and an object light beam;

means for directing the reference light beam at a second face of the coupling element such that it illuminates the interface between the holographic recording layer and the ambient medium at an angle greater than the critical angle;

means for directing the object light beam at the first face of the coupling element such that it is overlaps the reference beam in the plane of the holographic recording medium on the substrate in contact with the first face, whereby the holographic recording medium is a photoresist and the directing means for the reference light beam further arranges that the angle of incidence of the reference beam in the holographic recording layer is less than 45°, preferably less than 42° and most preferably less than 40° and means are provided for arranging the planes of polarisation of the object and reference beams incident on the holographic recording medium such that their polarisation vectors are substantially mutually orthogonal in the holographic recording medium and such that the polarisation vectors of the incident and totally internally reflected reference beams are also substantially orthogonal. Further advantageous embodiments of the invention are defined in the dependent claims.

Advantageously a photoresist is selected whose refractive index is higher than a value of 1.6 and preferably higher than 1.7 at the wavelength of the light source.

For a more complete understanding of the present invention, reference is now made to the figures, like numerals being used for like and corresponding parts of the various drawings.

Figure 2:
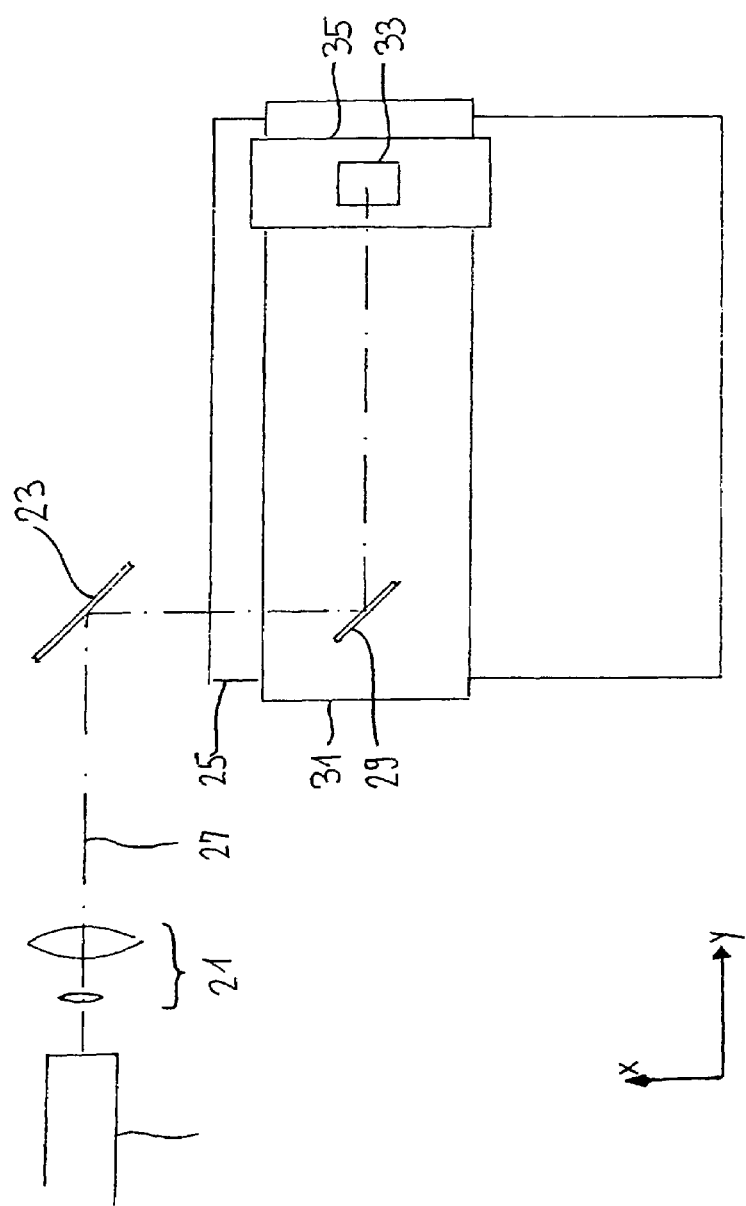
Figure 3:
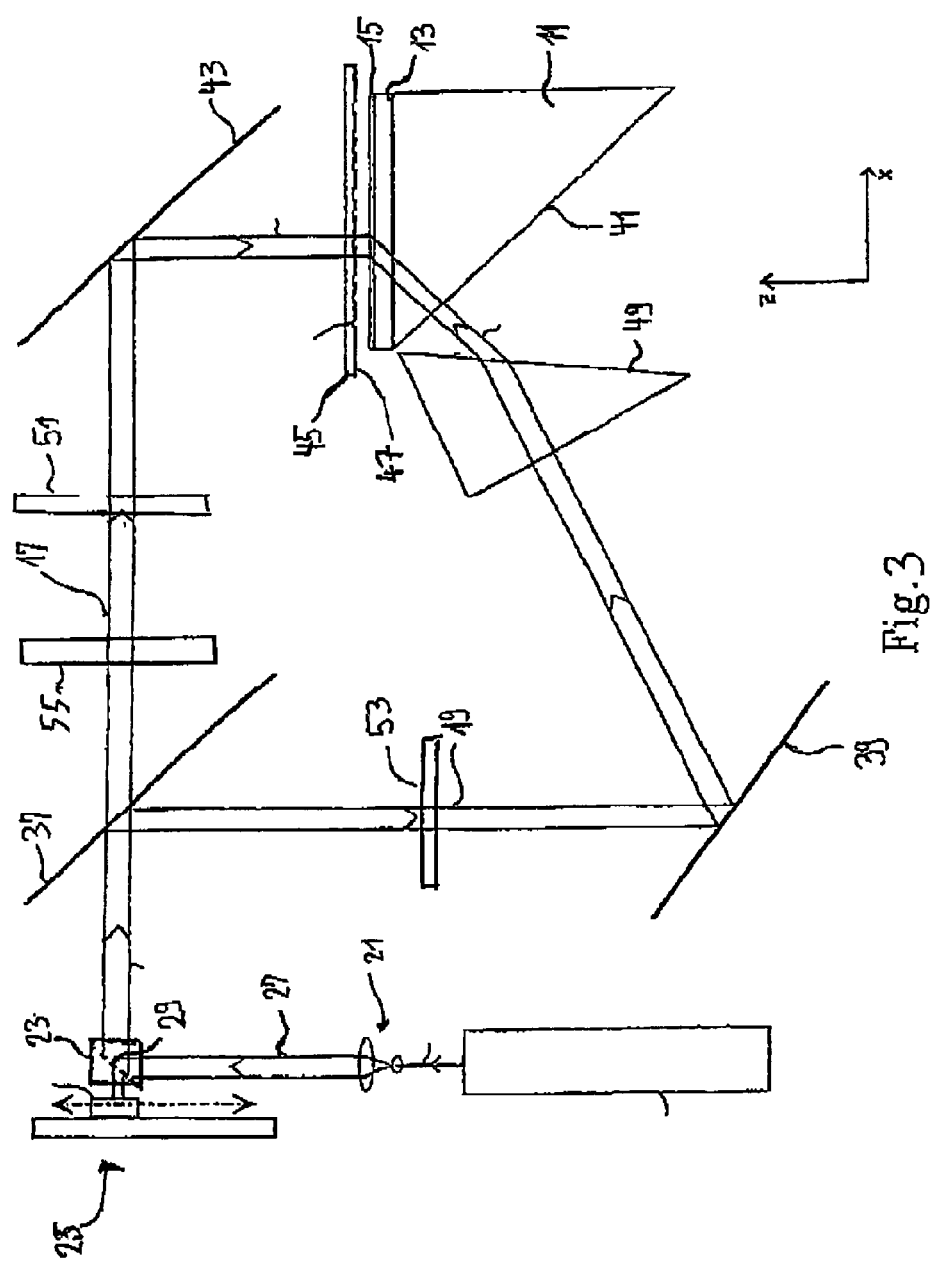

FIG. 1 is a schematic view of a total internal reflection (TIR) holographic recording apparatus comprising a scanning stage for scanning an illumination beam in x and y direction (only x dimension shown);

FIG. 2 a view of the scanning stage from above;

FIG. 3 the inventive TIR holographic recording system

FIG. 1 shows a known TIR holographic system for forming an a hologram from a mask pattern. It comprises a prism 11 which a substrate 13 bearing a holographic recording layer 15 is index-matched by means of an appropriate matching fluid. The matching fluid is applied between prism 11 and substrate 13 and exhibits the same refractive index as the prism 11 and substrate material so that a light beam which passes from the prism 11 into the substrate 13 preferably is not reflected at the prism/substrate interface.

For forming a hologram two light beams are necessary, an object beam 17 and a reference beam 19. The object and reference beams 17, 19 are coherent laser beams which are derived from the same laser source. The normally narrow laser light beam is first preferably expanded and collimated by an expansion and collimating optics 21 to a beam of a diameter of about 15 to 20 mm by a known optical expansion means. Thereafter the expanded and collimated beam is directed by a mirror 23 towards a xy scanning stage 25. The two-axes xy scanning stage serves to deflect the collimated light beam 27 such that the beam can traverse in a raster pattern essentially the entire prism face onto which the substrate 13 bearing the recording medium 15 is arranged. For this purpose the scanning stage 25 (see FIG. 2) comprises a first mirror 29 on a first carriage 31 movable in the x direction which deflects the light beam to a second mirror 33 on a second stage 35 moveable in the x direction that is also mounted to the first carriage. This second mirror 35 deflects the beam onto further large mirrors 37, 39 such that the light beam enters the prism 11 through the hypotenuse face 41 and arrives at the substrate bearing face of the prism at an angle which is greater than the critical angle. For, the orientation of the stage system it is preferable that the beam be scanned in the x direction and stepped in the y direction (it also allows the beam to be scanned in the y direction and stepped in the x direction, though this is not desirable because of mechanical wear to the first stage).

The mirror 37 is semi-transparent and functions as beam splitter for generating the object beam 17. The object beam 17 is directed to mirror 43 which deflects the beam 17 towards the substrate 13 at normal incidence.

For forming the hologram a mask 45 containing a mask pattern 47 is placed parallel and in a spaced relationship to the substrate 13. The object beam 17 penetrates the mask 45 and the transmitted light of the object beam interferes with the reference beam 19.

For forming a large-size hologram the reference and object light beams are preferably scanned in an aligned relationship across the entire mask 45 and substrate 13 surfaces in a raster scan-and-step operation whereby the object and the reference beams 17, 19 interfere with each other in the holographic recording medium 15 thereby forming the desired hologram.

In order that the object and reference beams 17, 19 remain superposed as they scan across the mask and recording layer, an additional prism 49 is provided in the light path of the reference beam which compresses the reference beam in one direction.

The reconstruction of an image from the hologram requires that the direction of the reference light beam is reversed, i.e. being in the opposite direction to that of the reference beam in the hologram formation process. The interaction of the reversed light beam or reconstruction beam, with the hologram produces a positive image of the circuit pattern in the photosensitive layer or, for instance, a silicon wafer placed at the same distance from the hologram as was the mask from the recording layer during the hologram formation process.

In order that the image generated from the hologram can be later printed in focus it is preferable that during the exposure the local gap between mask and recording layer where the beams are illuminating them is continuously measured and adjusted to a constant value. The apparatus and methodology for this are not described here since they are adequately described already in the prior-art.

FIG. 3 shows an embodiment according to the present invention. The laser source in this case is a frequency-doubled argon ion laser emitting a beam at a wavelength of 248 nm. The transmissive components in the optical system including the beamsplitter, prisms, hologram substrate and lens are manufacture from fused silica which is transparent at the wavelength of 248 nm.

According to the invention a photoresist is selected as the holographic recording medium 15, in particular a 250 nm thick layer of the SNR 240 manufactured by Shipley. This resist has a refractive index of 1.8 at the exposure wavelength. The mirror 39 directs the reference beam into the prism 11 such that the angle of incidence of the beam in the photoresist layer is 36°. The planes of polarisation of the object and reference beams incident on the holographic recording medium are arranged such that their polarisation vectors are according ot the values calculated in the example quoted earlier in the summary of the invention so that they are substantially mutually orthogonal in the holographic recording medium and such that the polarisation vectors of the incident and totally internally reflected reference beams are also substantially orthogonal in order that the transmission hologram is preferentially recorded in the holographic recording layer. The latter is achieved by providing polarisation ratating plates 51, 53 arranged in the light paths of the object and reference beams 17, 19. Alternatively such polarisation rotating means for the object and reference beams might be integrated into the beamsplitter component.

A filter plate 55 is additionally included in the object beam path such that the object-t-reference beam intensity ratio is 1:4.

The exposure parameters, namely the laser power, scanning speed and step size are selected in order that the depth of the surface-relief profile formed in the developed resist is preferably greater that 50 nm and optimally about 100 nm.

To minimise scattering in the developed structure it is advisable that a slow and gentle development process be used in particular the developer MF322 manufactured by Shipley diluted 1:1 with water and that the solution be cooled to a temperature of ~9° C. The development time of a 5 s can be employed. It is further recommended that the resist be prebaked at a temperature of 130° C. prior th exposure to drive off solvents that can also result in increased scattering in the final structure. It is also recommended that its resist is coated using an enclosed chuck.

It is to be noted that for the purpose of the present invention scanning of the reference and object beams is not an essential feature and that, accordingly, also stationary expanded beams can be used as disclosed in U.S. Pat. No. 4,966,428 to Phillips.

The present invention relates to a method and an apparatus or system for forming a hologram from a mask. According to the invention a photoresist is used as the holographic recording medium and the planes of polarisation of the object and reference beams incident on the holographic recording medium are arranged such that their polarisation vectors are substantially mutually orthogonal in the holographic recording medium and such that the polarisation vectors of the incident and totally internally reflected reference beams are also substantially orthogonal. Preferably the object and the incident reference beams as well as their polarisations are selected or adjusted that essentially just the transmission hologram is recorded in the holographic recording layer and that at least the reflection hologram is essentially suppressed.

The invention claimed is:

1. Method of forming a hologram from a information containing mask, comprising the following steps:
    arranging a substrate bearing a layer of a holographic recording medium on a first face of a coupling element and in optical contact therewith;
    arranging a information containing mask in a spaced relationship and parallel to the substrate;
    generating an illumination light beam and then splitting the light beam into an object beam and a reference beam;
    directing the reference beam to a second face of the coupling element in a way that the condition for total internal reflection at the interface between the recording medium and the ambient medium is fulfilled
    directing the object beam through the mask to the substrate such that it overlaps with the reference beam in the holographic recording medium;
    employing a photoresist as the holographic recording medium; and
    arranging the planes of polarisation of the object and reference beams incident on the holographic recording medium such that their polarisation vectors are substantially mutually orthogonal in the holographic recording medium and such that the polarisation vectors of the incident and totally internally reflected reference beams are also substantially orthogonal; and
    the step of employing a photoresist includes employing a photoresist whose layer thickness is less than 500 nm.

2. Method according to claim 1, characterized in that substantially only a transmission hologram is recorded in the holographic recording layer.

3. Method according to claim 1, characterized in that a photoresist is employed whose refractive index at the exposure wavelength is greater than 1.6.

4. Method according to claim 1, characterized in that the plane of polarisation of the object beam is at 45° to the plane of incidence of the reference beam at the holographic recording layer.

5. Method according to claim 1, characterized in that the photoresist material is selected such that its thickness (d) and absorption (a) meet the condition a*d<1.

6. Method according to claim 1, characterized in that the photoresist is selected such that its contrast described by its gamma-value satisfies the condition γ<3.

7. Method according to claim 1, characterized in that laser light of a wavelength below 300 nm for recording the hologram is used.

8. Method according to claim 1, characterized in that the intensity of the reference beam exceeds that of the object beam.

9. Method according to claim 1, characterized in that the intensity ratio of the reference and object beams is between 3:1 and 5:1.

10. Method according to claim 1, characterized in that the thickness of the photoresist layer is between 100 and 300 nm.

11. Method according to claim 1, characterized in that the illumination beam is scanned in a first direction such that the reference and object beams scan across the holographic recording medium and the mask respectively, stepping the illumination beam in a second direction perpendicular to the first direction, and then scanning the illumination beam again in the first direction and so on, such that the reference beam and object beam travel simultaneously across the face of the substrate in optical contact with the first face of the coupling element.

12. Method according to claim 1 characterized in that the gap between the holographic recording layer and the mask is determined, and then the di stance between the hologram and the recording medium adjusted to a predetermined value.

13. Method according to claim 1 characterized in that the reference beam is directed to a second face of the coupling element in a way that the condition for total internal reflection at the interface between the recording medium and the ambient medium is fulfilled and so that the angle of incidence of the beam in the recording layer is less than 45°.

14. Method according to claim 1, characterized in the photoresist is selected such that its resolution described by the smallest period of grating that can be optically recorded in the material is with a modulation depth $(d_{max}-d_{min})/(d_{max}+d_{min})>25\%$ satisfies the condition $\Lambda<200$ nm.

15. Method according to claim 1, characterized in the polarisation angles are selected according to the refractive index of the photoresist.

16. Method according to claim 1, characterized in that a combination of polarisation angles of between 37 to 44° for the reference beam and −43 to 47° for the object beam with respect to the plane of incidence are applied.

17. Method according to claim 1, characterized in that the intensity of the reference beam exceeds that of the object beam by at least a factor 2.

18. Method according to claim 1, characterized in that the image recorded in the photoresist as surface relief hologram is transferred into the substrate material by an etching process.

19. Method according to claim 1, characterized in that the etching process is a plasma etching process.

20. Method according to claim 1 characterized in that in the hologram reconstruction process the distance between the hologram and the substrate onto which the holographically recorded image is to be reconstructed is adjusted to the value as maintained between the holographic recording layer and the mask in the hologram formation process.

21. Use of the method according to claim 1 for recording features of less than 1 µm contained in a mask in a hologram for use in microlithography.

22. Hologram recorded in a recording medium according to claim 1, characterized in that a photoresist is employed whose refractive index at the exposure wavelength is greater than 1.6.

23. Total internal reflection holographic recording apparatus for recording a hologram from a mask comprising
    an optical coupling element for receiving a substrate on a first face;

a substrate bearing a holographic recording medium, the substrate being in optical contact with said first face of the optical coupling element, at least one light source for generating a light beam;

optical means for generating a collimated light beam of a selected cross-section;

means for generating two coherent light beams, a reference light beam and an object light beam;

means for directing the reference light beam at a second face of the coupling element such that it illuminates the interface between the holographic recording medium and the ambient medium at an angle greater than the critical angle;

means for directing the object light beam at the first face of the coupling element such that it is aligned with the reference beam in the plane of the holographic recording medium on the substrate in contact with the first face;

the holographic recording medium is a photoresist; and means are provided for arranging the planes of polarisation of the object and reference beams incident on the holographic recording medium such that their polarisation vectors are substantially mutually orthogonal in the holographic recording medium and such that the polarisation vectors of the incident and totally internally reflected reference beams are substantially orthogonal; and said photoresist being a layer having a thickness less than 500 nm.

24. Apparatus according to claim 23 characterized in that the at least one light source is a laser light source emitting light of a wavelength below 300 nm.

25. Apparatus according to claim 23, characterized in that a combination of polarisation angles of between 37 to 44° for the reference beam and −43 to −47° for the object beam are applied.

26. Apparatus according to claim 23, characterized in that means are provided for adjusting the intensities of the object and reference beams such that the intensity of the object beam exceeds that of the reference beam.

27. Apparatus according to claim 23, characterized in that the thickness of the photoresist layer is between 100 and 300 nm.

28. Apparatus according to claim 23, further characterized in that the directing means for the reference light beam further arranges that the angle of incidence of the reference beam in the holographic recording layer is less than 45°.

29. Apparatus according to claim 23, characterized in that the photoresist material is such that its thickness (d) and absorption (a) meet the condition a*d<1.

30. Apparatus according to claim 23, characterized in that the photoresist material is such that that its contrast described by its gamma factor satisfies the condition γ<3.

31. Apparatus according to claim 23, characterized in that the intensity of the object beam exceeds that of the reference beam by at least of a factor 2.

32. Apparatus according to claim 23, characterized in that means are provided for scanning and stepping the incident light beam in a raster scan across the beam splitting means in a first and in a second direction, respectively, such that the reference and object beams travel simultaneously across the first face or the substrate in optical contact with the first face.

33. Apparatus according to claim 23 further comprising means for measuring the gap between the hologram and a wafer being arranged in a spaced relationship to the hologram; and means for adjusting the parallelism and/or separation between the hologram and the wafer.

34. Apparatus according to claim 23 characterized in that the photoresist employed has a refractive index at the exposure wavelength of greater than 1.6.

35. Apparatus according to claim 34, characterized in that the at least one light source is a laser light source emitting light of a wavelength below 300 nm.

36. Total internal reflection holographic recording apparatus or system for recording a hologram from a mask, comprising an optical coupling element for receiving a substrate on a first face;

a substrate bearing a holographic recording medium, the substrate being in optical contact with said first face of the optical coupling element, at least one light source for generating a light beam;

optical means for generating a collimated light beam of a selected cross-section;

means for generating two coherent light beams, a reference light beam and an object light beam;

means for directing the reference light beam at a second face of the coupling element such that it illuminates the interface between the holographic recording medium and the ambient medium at an angle greater than the critical angle;

means for directing the object light beam at the first face of the coupling element such that it is aligned with the reference beam in the plane of the holographic recording medium on the substrate in contact with the first face;

the holographic recording medium is a photoresist;

means are provided for arranging the planes of polarisation of the object and reference beams incident on the holographic recording medium such that their polarisation vectors are substantially mutually orthogonal in the holographic recording medium and such that the polarisation vectors of the incident and totally internally reflected reference beams are substantially orthogonal; and in that the directing means for the reference light beam further arranges that the angle of incidence of the reference beam in the holographic recording layer is less than 45°; and said photoresist being a layer having a thickness less than 500 nm.

37. Method of forming a hologram from a information containing mask, comprising the following steps:

arranging a substrate bearing a layer of a holographic recording medium on a first face of a coupling element and in optical contact therewith;

arranging a information containing mask in a spaced relationship and parallel to the substrate;

generating an illumination light beam and then splitting the light beam into an object beam and a reference beam;

directing the object beam through the mask to the substrate such that it overlaps with the reference beam in the holographic recording medium;

employing a photoresist as the holographic recording medium;

directing the reference beam to a second face of the coupling element in a way that the condition for total internal reflection at the interface between the recording medium and the ambient medium is fulfilled and so that the angle of incidence of the beam in the recording layer is less than 45°;

arranging the planes of polarisation of the object and reference beams incident on the holographic recording medium such that their polarisation vectors are substantially mutually orthogonal in the holographic recording medium and such that the polarisation vectors of the incident and totally internally reflected reference beams are also substantially orthogonal; and the step of employing a photoresist includes employing a photoresist whose layer thickness is less than 500 nm.

38. Method according to claim 37 characterized in that a photoresist is employed whose refractive index at the exposure wavelength is greater than 1.6.

39. Method according to claim 37, characterized in that substantially only a transmission hologram is recorded in the holographic recording layer.

* * * * *